United States Patent [19]
Kim

[11] Patent Number: 6,166,416
[45] Date of Patent: Dec. 26, 2000

[54] CMOS ANALOG SEMICONDUCTOR APPARATUS AND FABRICATION METHOD THEREOF

[75] Inventor: Yong Chan Kim, Kyungsangbuk-Do, Rep. of Korea

[73] Assignee: Hyundai Electronics Industries Co., Ltd., Ichon-shi, Rep. of Korea

[21] Appl. No.: 09/002,242

[22] Filed: Dec. 31, 1997

Related U.S. Application Data

[62] Division of application No. 08/759,209, Dec. 5, 1996, Pat. No. 5,714,410.

[30] Foreign Application Priority Data

Dec. 7, 1995 [KR] Rep. of Korea ................. 95-47367

[51] Int. Cl.⁷ .................. H01L 29/92; H01L 29/45
[52] U.S. Cl. ................ 257/379; 257/752; 257/755; 257/756
[58] Field of Search .................. 257/379, 752, 257/755, 756

[56] References Cited

U.S. PATENT DOCUMENTS

| | | | |
|---|---|---|---|
| 5,072,275 | 12/1991 | Vora | 257/755 |
| 5,393,691 | 2/1995 | Hsu et al. | 437/60 |
| 5,395,782 | 3/1995 | Ohkoda et al. | 437/60 |
| 5,424,572 | 6/1995 | Solheim | 257/755 |
| 5,475,240 | 12/1995 | Sakamoto | 257/755 |
| 5,506,158 | 4/1996 | Eklund | 437/60 |
| 5,536,673 | 7/1996 | Hong et al. | 437/60 |
| 5,879,997 | 3/1999 | Lee | 438/300 |
| 5,981,331 | 11/1999 | Tsunemine | 438/240 |

FOREIGN PATENT DOCUMENTS 61-144872  7/1986  Japan ................. 257/756

*Primary Examiner*—Jerome Jackson, Jr.
*Attorney, Agent, or Firm*—Fleshner & Kim, LLP

[57] ABSTRACT

A CMOS analog semiconductor apparatus and a fabrication method thereof are provided that are capable of selectively oxidizing a polysilicon to form a single layer having a conductive region and an insulation region of a semiconductor apparatus. The apparatus and method improve at least a step coverage problem of a semiconductor apparatus by using a simpler process. Further, the apparatus and method reduce a defective wiring and cracks to increase yield and reliability of the product. The apparatus can include a capacitor having a lower electrode formed on the field insulation layer of the semiconductor substrate, a first insulation layer formed on the field insulation layer including the lower electrode so as to expose a contact region for connecting with the lower electrode. An upper electrode is formed on an upper surface of the first insulation layer over the lower electrode except for the contact region. A resistance device is formed on the upper electrode. A lower electrode connection layer forms a contact portion with the lower electrode. A second insulation layer further defines the contact portion and insulates the upper electrode and the lower electrode connection layer. Finally, a patterned metallic layer contacts the lower electrode connection layer.

18 Claims, 8 Drawing Sheets

FIG. 1

CONVENTIONAL ART

CMOS ANALOG SEMICONDUCTOR APPARATUS AND FABRICATION METHOD THEREOF

This application is a Divisional of application Ser. No. 08/759,209 filed Dec. 5, 1996 now U.S. Pat. No. 5,714,410.

BACKGROUND OF THE INVENTION

1. Field of the Invention

The present invention relates to a CMOS analog semiconductor apparatus and a fabrication method thereof which are capable of selectively oxidizing polysilicon, and forming a conductive region and an insulation region of a semiconductor apparatus, for thus improving a metal step coverage of the semiconductor apparatus by using a simpler process, so that it is possible to reduce a defective wiring and cracks, and to increase a yield and reliability of the product.

2. Description of the Conventional Art

Figure 1:
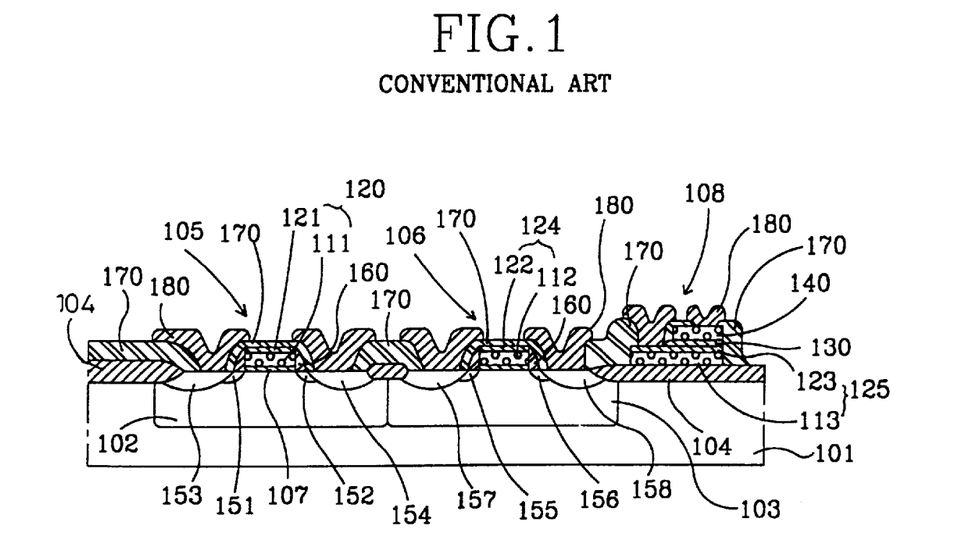
FIG. 1 is a cross-sectional view illustrating a conventional CMOS analog semiconductor apparatus.

FIG. 1 is a cross-sectional view illustrating a conventional CMOS analog semiconductor apparatus.

As shown therein, the conventional CMOS analog semiconductor includes a semiconductor substrate 101, a p-well 102 and an n-well 103 formed by implanting a dopant into the semiconductor substrate 101, a field insulation field 104 formed on the semiconductor substrate 101 except for the p-well 102 and the n-well 102, an n-type MOS field effect transistor (an n-type MOSFET) 105 formed on the p-well 102, a p-type MOS field effect transistor (a p-type MOSFET) 106 formed on the n-well 103, a capacitor 108 formed on the field insulation layer 104, and a resistor (not shown).

The n-type MOSFET 105 includes a gate insulation layer 107 formed on the p-well 102, a gate electrode 120 formed on the gate insulation layer 107 having a stack structure of the polysilicon layer 111 and a silicide layer 121, source/drain regions 153 and 154 including lightly doped drains (LDD) 151 and 152 formed in an inner portion of the semiconductor substrate 101 to be positioned at both sides of the gate electrode 120 by a predetermined depth, a side wall spacer 160 formed on both sides of the gate insulation layer 107 and the gate electrode 120, an insulation layer 170 in which a low temperature oxide and a boron-phospho-silicate glass film are sequentially formed on the gate electrode 120 and the field insulation layer 104 including the side wall spacer 160, and a metallic layer 180 formed on the insulation layer 170 and forming a contact portion with respect to the source/drain 153 and 154 and an electric wiring. In addition, the p-type MOSFET 106 formed on the n-type well 103 has the opposing structure with respect to the n-type MOSFET.

In addition, the capacitor 108 and the resistor (not shown) formed on the field insulation layer 104 at one side of the MOSFET device includes a lower electrode 125 formed on the field insulation layer 104 having a stack structure of the polysilicon 113 and the silicide layer 123, an insulation layer 130 formed on a region of the lower electrode 125, an upper electrode 140 formed on the insulation layer 130, an insulation layer 170 on which an LTO film and a BPSG film are sequentially deposited to expose a contact region of the lower electrode 125 and the upper electrode 140, a metallic layer 180 for forming a contact portion with respect to the silicide layer 123 of the lower electrode 125 and for forming a lower electrode wiring, a resistance device (not shown) formed on the upper electrode 140, and a metallic layer 180 for forming a contact portion with respect to the resistor and an upper electrode wiring.

Here, the metallic layer 180 formed on the silicide layer 123 and the resistor of the lower electrode is an electrode wiring which is formed by the same process.

Meanwhile, the conventional CMOS analog semiconductor apparatus and a fabrication method thereof will now be explained in more detail with reference to FIGS. 2A and 2B.

Figure 2A:
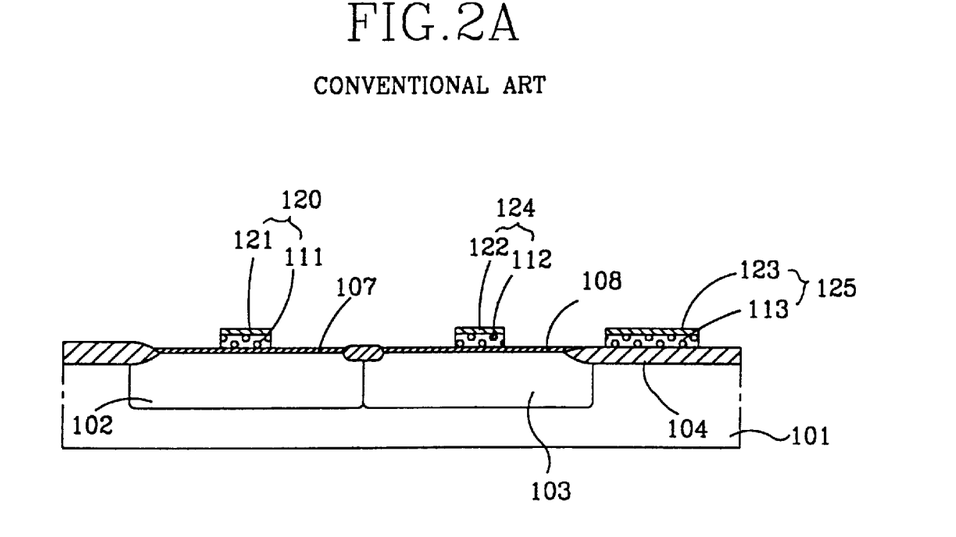
FIGS. 2A through 2D are cross-sectional view illustrating a fabrication method of a conventional CMOS analog semiconductor apparatus.

First, as shown in FIG. 2A, the p-well region and the n-well region are defined so as to form a CMOS device on the semiconductor substrate 101, and then the p-type and n-type dopant is ion-implanted thereinto, thus forming a double well (a p-well 102 and an n-well 103).

The field insulation layer 104 is formed on the semiconductor substrate 101 except for the upper portion of a conjunction portion of the p-well 102 and the n-well 103 and the well regions, for thus defining a device isolation region.

The gate insulation layer 107 is formed of an oxide film, etc, on the p-well 102 and the n-well 103 of the semiconductor substrate 101, and the polysilicon film and the silicide layer are sequentially deposited in the semiconductor substrate 102 including the p-well 102, the n-well 103, and the field insulation layer 104, and the resultant structure is patterned by a photolithography process, so that the lower electrode 125 of a capacitor formed in a stack structure of the polysilicon layer 113 and the silicide layer 123 on the gate electrodes 120 and 124 formed in a stack structure of the polysilicon layers 111 and 112 and the silicide layers 121 and 122 and the field insulation layer 104 in the right side of the n-well 103.

Figure 2B:
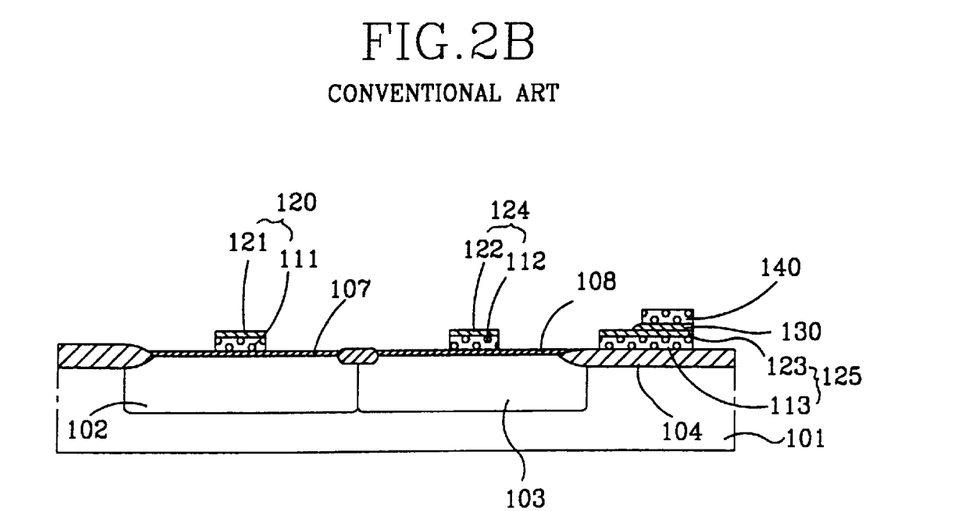

Thereafter, as shown in FIG. 2B, the oxide film and polysilicon are sequentially deposited on the semiconductor substrate 101 including the lower electrode 125 of the capacitor, and the resultant structure is patterned, for thus forming the insulation layer 130 and the upper electrode 140. Here, the resistor device (not shown) is formed by using the polysilicon layer.

In addition, the insulation layer 130 and the upper electrode 140 are formed to have a smaller size than the lower electrode 125 in order to obtain a contact region of the lower electrode 125.

Figure 2C:
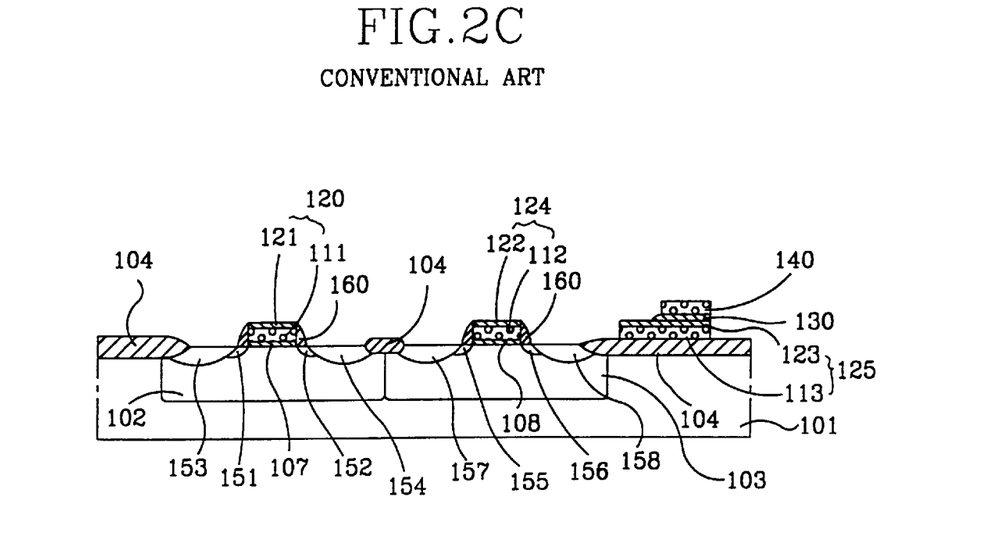

As shown in FIG. 2C, the gate insulation layer 107 left on the p-well and n-well of the semiconductor substrate 101 is removed by an etching process. A dopant is implanted into the resultant structure in a self-alignment method by using the gate electrodes 120 and 124 in the p-well 102 and n-well 103 as a mask. Thereafter, the LDD regions 151, 152, 155, and 156 are formed. The side wall spacer 160 is formed at both sides of the gate electrodes 120 and 124, and source-drain regions 153, 154, 157, and 158 are formed in the p-well and n-well in the self-alignment method by using the gate electrodes 120 and 124 and the side wall spacer 160 as a mask.

Figure 2D:
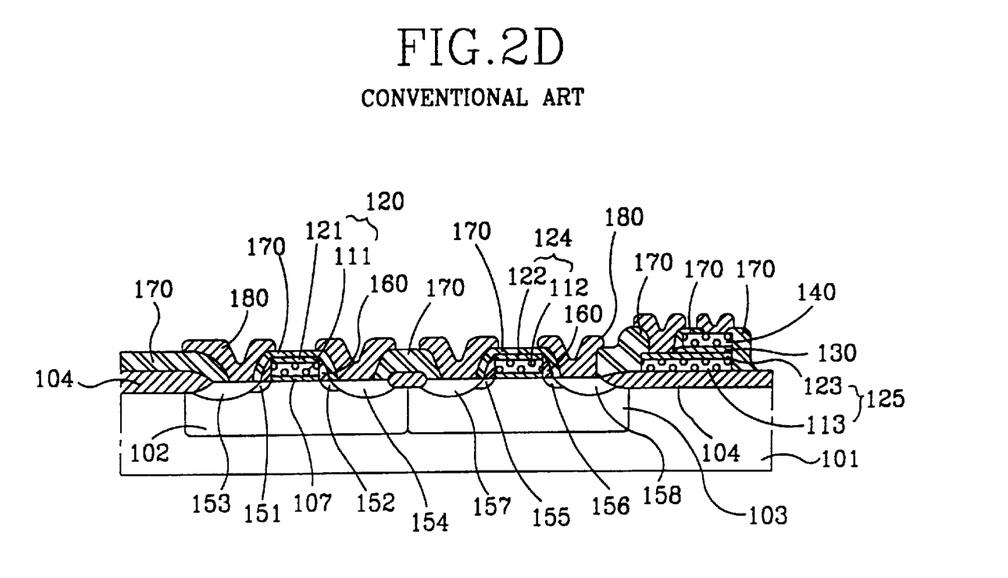
Figure 3:
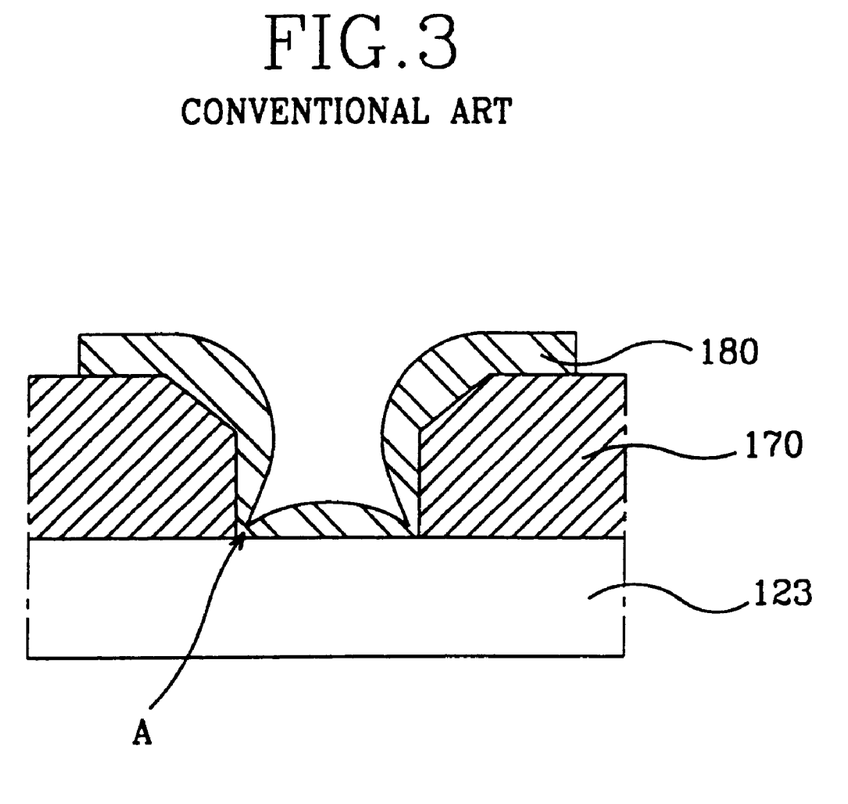
FIG. 3 is an enlarged cross-sectional view illustrating a contact portion contacting with a lower electrode of a capacitor of FIG. 1.

Thereafter, as shown in FIG. 2D, the LTO film (a lower portion of the insulation layer 170) and the BPSG film (an upper portion of the insulation layer 170) are sequentially deposited on the front surface of the semiconductor substrate 101, for thus forming the insulation layer 170, and the insulation layer 170 is patterned so a to expose the source-drain region of the p-MOSFET device 105 and the n-MOSFET 106. An aluminum film is deposited on the semiconductor substrate 101 including the insulation layer 170, and then is selectively etched, for thus forming a metallic layer 180. Therefore, the CMOS analog semiconductor apparatus as shown in FIG. 1 is fabricated.

However, since the semiconductor device is fabricated to have a sub-micron accuracy, and the reduction of the contact size causes an increase of the aspect ratio. As shown in FIGS. 2A through 2D, in the conventional CMOS analog semiconductor apparatus, in one among a plurality of contacts, namely, the contact portion contacting with the lower electrode of the capacitor), the aluminum layer 180 deposited on the device with respect to the contact hole is not evenly deposited in the contact hole, and there is formed a step coverage problem in the metal (in particular, an "A"-portion) Therefore, the defective wiring and crack occur, for thus degrading the yield of the semiconductor apparatus and the reliability of the product.

SUMMARY OF THE INVENTION

Accordingly, it is an object of the present invention to provide a CMOS analog semiconductor apparatus and a fabrication method thereof which overcomes the problems encountered in the conventional art.

It is another object of the present invention to provide an improved CMOS analog semiconductor apparatus and a fabrication method thereof which are capable of selectively oxidizing a polysilicon, and forming a conductive region and an insulation region of a semiconductor apparatus, for thus improving a metal step coverage of the semiconductor apparatus by using a simpler process, so that it is possible to reduce a defective wiring and crack, and to increase a yield and reliability of the product.

To achieve the above objects, there is provided a CMOS analog semiconductor apparatus which includes a semiconductor substrate having a device region of a first well and a second well and a device isolation region formed by a field insulation layer, first and second gate electrodes formed on the first and second well regions of the semiconductor substrate, respectively, first and second MOS field effect transistors including first and second source/drain regions formed in the first and second wells to be arranged at both lateral sides of the first and second gate electrodes, a first insulation layer formed at both lateral sides of the first and second gate electrodes and on the upper surface thereof, and in the field insulation layer, a conductive layer contacting with both lateral sides of the first and second gate electrodes and contacting with the first and second source/drains, a second insulation layer contacting with the conductive layer in the first insulation layer of the field insulation layer and formed in the first insulation layer of the first and second gate electrodes, a metallic layer contacting with the conductive layer, and a capacitor including a lower electrode formed on the field insulation layer of the semiconductor substrate, a first insulation layer formed on the field insulation layer including the lower electrode so as to expose a contact region for connecting with the first insulation layer, an upper electrode formed on an upper surface except for the contact region of the first insulation layer, a resistance device formed on the upper electrode, a lower electrode connection layer for forming a contact portion with the lower electrode, a second insulation layer formed in a region of the silicide layers of the first insulation layer and the lower electrode for insulating the upper electrode and the lower electrode connection layer, and a metallic layer for forming a contact portion with the upper and lower electrode layers.

To achieve the above objects, there is provided a semiconductor device that includes a gate electrode formed over semiconductor substrate, sidewall spacers adjacent both lateral sides of the gate electrode, wherein the sidewall spacers have a prescribed height, source/drain regions formed in the substrate at both lateral sides of the sidewall spacers, a conductive layer on the source/drain regions in the substrate, and a metallic layer on the conductive layer, wherein a combined height of the conductive layer and metallic layer is at least equal to the prescribed height of the sidewall spacers.

To achieve the above objects, there is provided a semiconductor device that includes a first capacitor electrode over a semiconductor substrate, a dielectric layer formed over a portion of the first capacitor electrode, a single layer formed on the dielectric layer, wherein the single layer includes nonconductive regions defining a first contact hole and a conductive region formed in the first contact hole and serving as a second capacitor electrode, and a metallic layer contacting the second capacitor electrode in the first contact hole.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The CMOS analog semiconductor apparatus and a fabrication method thereof according to the present invention will now be explained with reference to FIGS. 4 through 6E.

Figure 4:
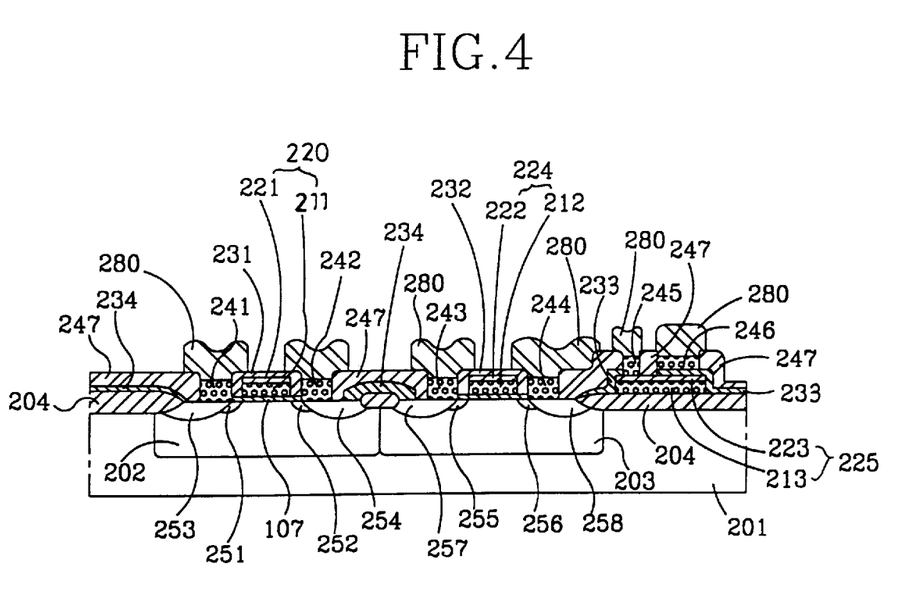
FIG. 4 is a cross-sectional view illustrating a CMOS analog semiconductor apparatus according to the present invention.

First, as shown in FIG. 4, the CMOS analog semiconductor apparatus according to the present invention includes a p-well 202 and an n-well 203 formed by diffusing a dopant on the p-well and n-well regions defined on a semiconductor substrate 201, a CMOS device formed by forming an n-type MOS field effect transistor and a p-type MOS field effect transistor on the p-well and n-well regions, and a capacitor and a resistor (not shown) formed on the semiconductor substrate 201 to be arranged in one side of the CMOS device.

In the CMOS device, an n-type MOSFET is formed in the p-well (a first well 202), and a p-type MOSFET is formed in the n-well (a second well 203). The n-type MOSFETs 251 and 252 formed in the p-well (the first well 202) includes first n-type source/drains 253 and 254 having the LDD structures 251 and 252, a gate insulation layer 207 formed on the first well 202, a first gate electrode 220 formed on the gate insulation layer 207 to have a stack structure of a first polysilicon layer 211 and the silicide layer 221, first insulation layers 231 and 234 formed on the upper and lateral surfaces of the first gate electrode 220 and on a field insulation layer 204, conductive layers 241 and 242 contacting with both sides of the first insulation layer 231 and contacting with the first source/drains 253 and 254, a second insulation layer 247 formed on the first insulation layer 234 of the field insulation layer 204, and contacting with the conductive layers 241 and 242, and formed on the first insulation layer 231, and a metallic layer 280 formed by depositing an aluminum film on the conductive layers 241 and 242 and used as an electrode wiring forming a contact portion with the conductive layers 241 and 242.

In addition, the p-type MOSFET formed on the n-well (the second well 203) has a matching construction with respect to the n-type MOSFET. Namely, the first source/drains 253 and 254 of the n-type matches with the second source/drains 257 and 258 of the p-type, and the first gate electrode 220 matches with the second gate 224.

In addition, in the field oxide film formed in a portion except for the upper portion of the conjugation of the p-well and n-well of the semiconductor substrate 201 and the well region, the resistor and the capacitor are formed on the field insulation layer 204 arranged in one side of the CMOS device. There are formed a lower electrode 225 formed on the field insulation layer 204 of the semiconductor substrate 201 in a stack structure of the polysilicon layer 213 and the silicide layer 223, a first insulation layer 233 formed on the field insulation layer 204 including the lower electrode 225 to expose the contact region for connecting with the lower electrode 225, an upper electrode 246 formed on a portion except for the contact region on the insulation layer 233, a lower electrode connection layer 245 forming a contact portion with the lower electrode 225, the second insulation layer 247 formed on the first insulation layer 233 and the silicide layer 223 of the lower electrode 225 for insulating the upper electrode and the lower electrode connection layer 245 and 246, a resistor (not shown) formed on the upper electrode 246, and a metallic layer 280 formed on the upper electrode and the lower electrode connection layer 245 and 246. Since the upper electrode 246 formed of a second polysilicon material, the lower electrode connection layer, and the metallic layers 245 and 280 are formed on the lower electrode 225, the width of the upper electrode 246 is smaller than the lower electrode 225.

Figure 5:
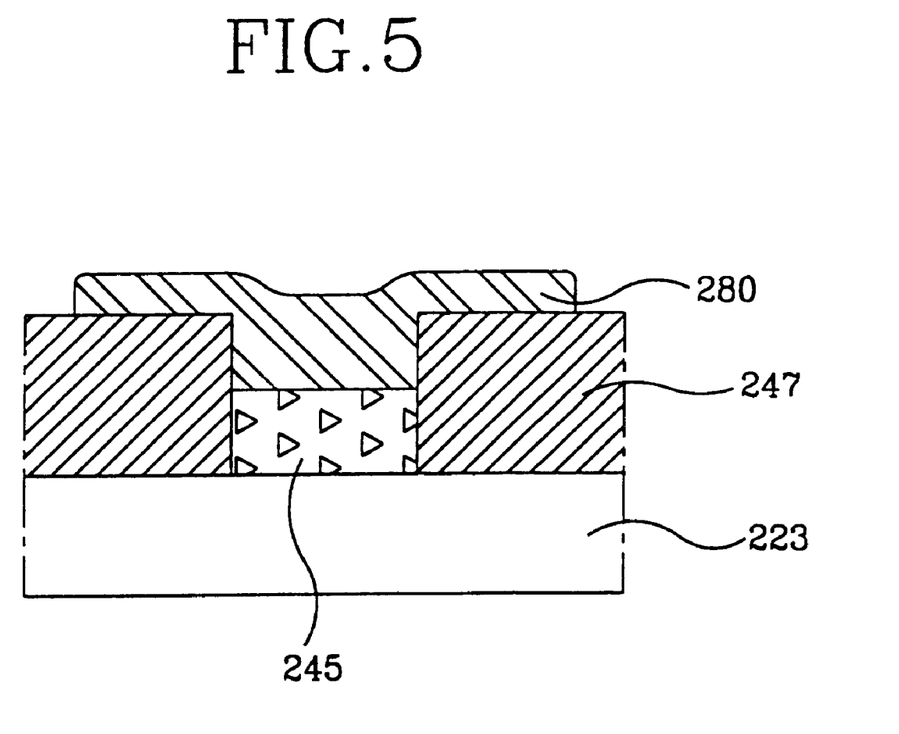
FIG. 5 is an enlarged cross-sectional view illustrating a contact portion contacting with a lower electrode of a capacitor of FIG. 4 according to the present invention.

FIG. 5 is an enlarged cross-sectional view illustrating a contact portion contacting with a lower electrode of a capacitor of FIG. 4 according to the present invention.

As shown therein, there are formed a lower electrode connection layer 245 contacting with the silicide layer 223 of the upper portion of the lower electrode by selectively oxidizing the second polysilicon layer deposited on the silicide layer 223 of the lower electrode 225, and the second insulation layer 247 formed of the second polysilicon oxide for insulating with a neighboring conductive device and formed on both sides of the lower electrode connection layer 245 by a selective oxide process of the second polysilicon layer. Thereafter, an aluminum film is formed on the lower electrode connection layer 245 and the second insulation film 247, and then is patterned, thus for forming the metallic layer 280. Therefore, the contact and wiring includes a first contact between the silicide layer 223 of the lower electrode and the lower electrode connection layer 245, and a second contact between the lower electrode connection layer 245 and the metallic layer 280, so that the metallic layer 280 does not directly contact with the silicide layer 223 of the lower electrode. Namely, a lower electrode connection layer is arranged therebetween, for thus forming a contact of the lower electrode/lower electrode connection layer/metallic layer.

The CMOS analog semiconductor fabrication method according to the present invention will now be explained with reference to FIGS. 6A through 6E.

Figure 6A:
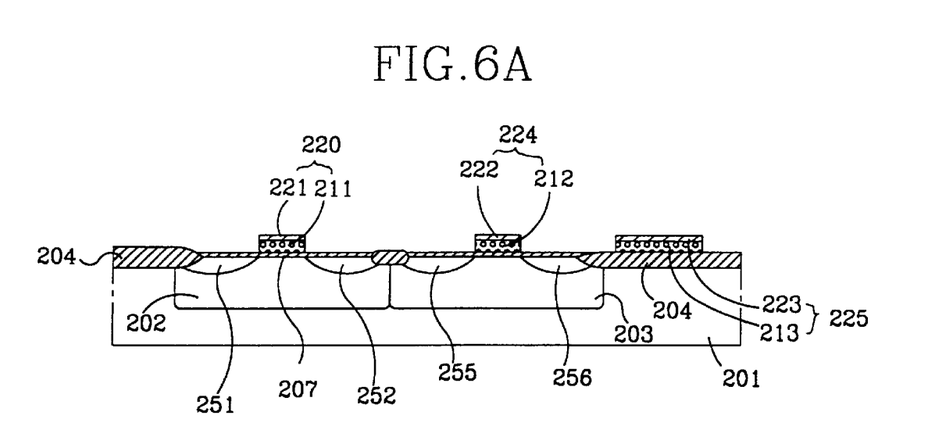
FIGS. 6A through 6E are cross-sectional views illustrating a fabrication method of a CMOS analog semiconductor apparatus according to the present invention.

As shown in FIG. 6A, a CMOS device region is defined in a region of the semiconductor substrate 201, and a dopant is implanted into the resultant structure, and the first well 202 and second well 203 are formed in the semiconductor substrate 201. In addition, the field insulation layer 204 is formed in a region except for the upper portion of the conjunction portion of the first well 202 and second well 203 and the well, for thus defining a device isolation region (including a capacitor formation region). Thereafter, the gate insulation layer 207 is formed on the first well 202 and the second well 203, and the first polysilicon film and silicide layer are sequentially formed on the front surface of the semiconductor substrate 201. Thereafter, the first and second gate electrodes 220 and 224 having a stack structure of the first polysilicon layer 211 and 212 and the silicide layers 221 and 222 are formed on the first well 202 and the second well 203 by a photolithography process. The lower electrode 225 of the capacitor having a stack structure of the first polysilicon layer 213 and the silicide layer 223 is formed on the field insulation layer 204 of the capacitor formation region. Thereafter, first lightly doped source/drains 251 and 252 and second lightly doped source/drain regions 255 and 256 are formed by using an ion implantation into the first and second wells in a self-alignment method by using the first and second gate electrodes 220 and 224 as a mask.

Figure 6B:
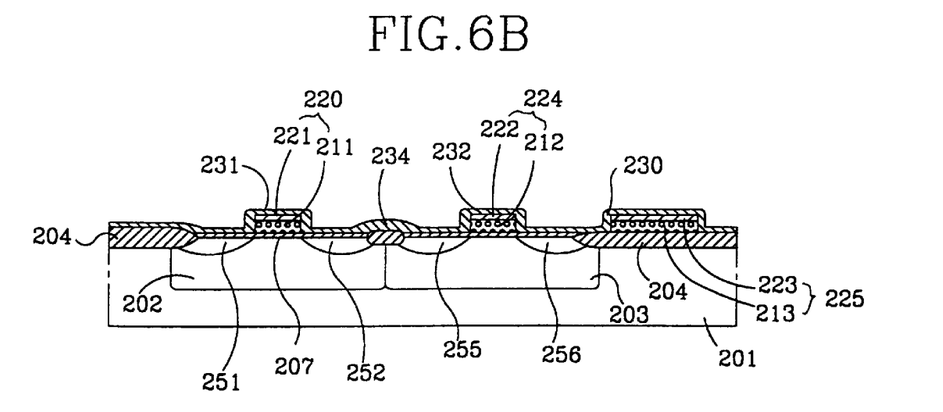

As shown in FIG. 6B, a material such as an oxide film, etc is deposited on the semiconductor substrate 201 including the first and second gate electrodes 220 and 224 and the capacitor lower electrode 225, for thus forming a first insulation layer 230.

Figure 6C:
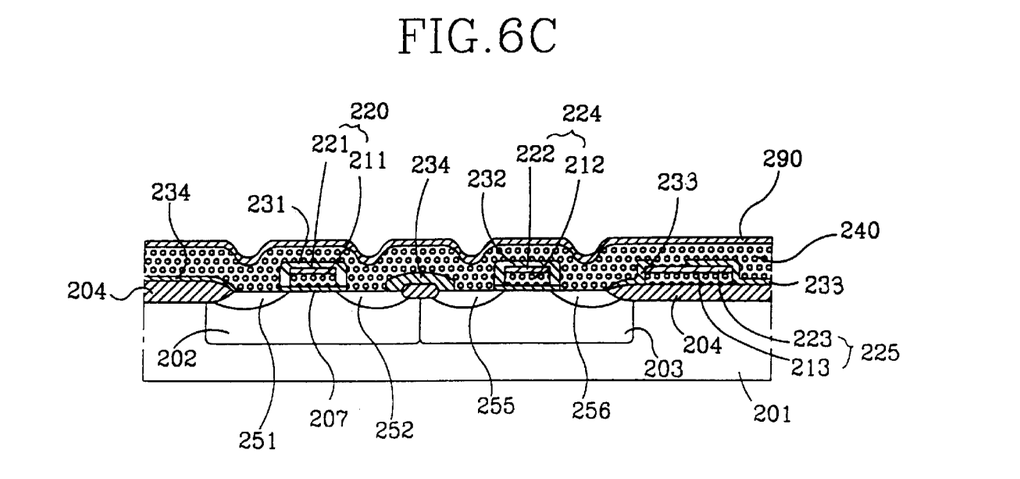

As shown in FIG. 6C, first insulation layers 231, 232, and 234 are formed on the capacitor lower electrode 225, the first gate electrode 220 and the upper surface and both sides of the second gate electrode 224, and the field insulation layer 204 by patterning the first insulation layer 230 by a photolithography process. Here, a contact region is formed by exposing a portion of the silicide layer 223 of the capacitor lower electrode 225. As a result, the upper surfaces of the first and second lightly doped source-drain regions 251, 252, 255, and 256 of the first well 202 and second well 203 are exposed. Thereafter, a stack structure of the second polysilicon layer 240 and a nitride layer 290 is formed on the semiconductor substrate 201 including the first insulation layers 231 through 234 patterned. The first insulation layer 233 formed on the silicide layer 223 of the lower electrode 225 of the capacitor is used as a capacitor dielectric layer.

Figure 6D:
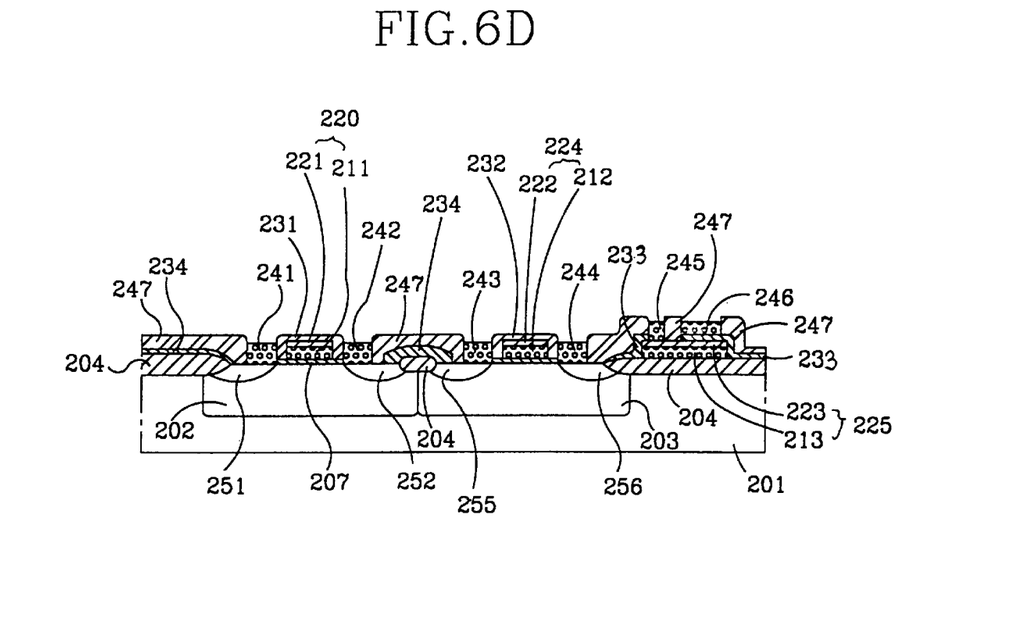

As shown in FIG. 6D, the nitride layer 290 is patterned by a photolithography process, and the second polysilicon layer 240 is selectively oxidized by using the patterned nitride later as a mask, and then the nitride layer patterned is removed. Thereafter, a process for flattening the front surface of the second polysilicon layer 240 which was selectively oxidized may be performed by an etching process. The above-described flattening process may be performed for fully etching in order for the non-oxidized portion and oxidized portion to have the same height, and the flattening process may be performed in order for the non-oxidized portion to be removed more, for thus exposing the non-oxidized portion to be exposed more. In the patterning process, the contact region and the upper electrode region of the capacitor are not oxidized, and the remaining region is oxidized and become the second insulation layer 247 for electrically insulating the conductive layers 241 through 244 and the upper electrode and the lower electrode connection layer 245 and 246.

Figure 6E:
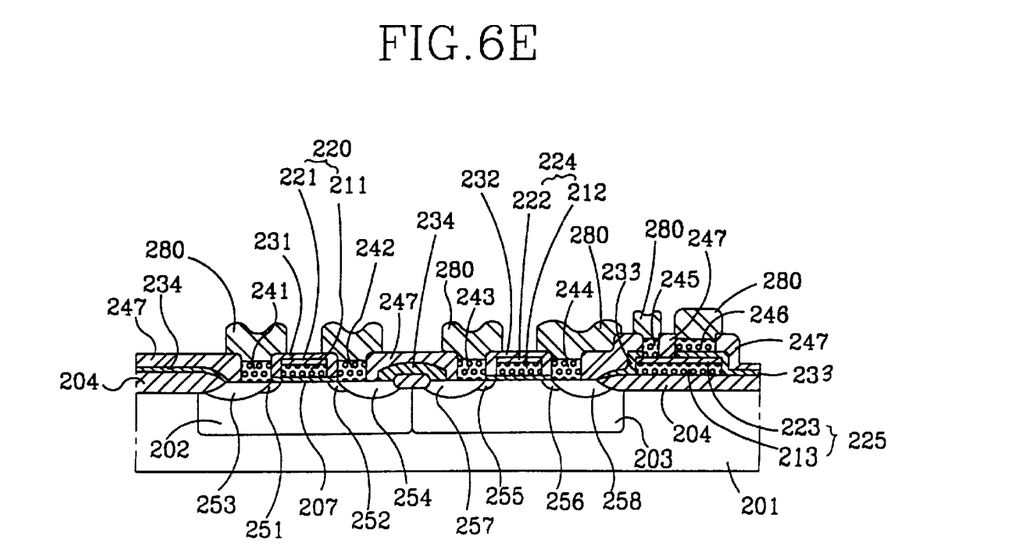

As shown in FIG. 6E, a high density ion in implanted into the source/drain region in the p-well 202 and n-well 203 of the semiconductor substrate 201 through the contact region of the CMOS device formed of the second polysilicon layer which was not oxidized in the selective oxidization process, and the resultant structure is annealed, so that the n-type first high density source/drains 253 and 254 is formed in the n-type MOSFET, and the second high density source/drains 257 and 258 are formed in the p-type MOSFET. Thereafter, an aluminum is deposited on the semiconductor substrate 201 including the first and second gate electrodes 220 and 224 and the upper electrode 246 of the capacitor, and is patterned, for thus forming the metallic layer 280. The metallic layer 280 may be formed by the following processes. Namely, a third insulation layer (not shown) is deposited on the selectively oxidized second insulation layer 247 and the upper electrode and the lower electrode connection layer 245 and 246 for insulating with other conductive devices, and then the patterning is performed so as to form a contact region. In addition, as another method, a metallic material such as an aluminum film, etc. may be deposited on the third insulation layer, and the patterning process is performed.

Therefore, the CMOS analog semiconductor apparatus fabricated by the processes as shown in FIGS. 6A through 6E is shown in FIG. 4.

As described above, the CMOS analog semiconductor apparatus and a fabrication method thereof according to the present invention is directed to forming a lower electrode and insulation layer forming a gate electrode and a capacitor of the CMOS device, depositing a polysilicon film on the upper surface thereof, and selectively oxidizing the resultant structure. In addition, the upper electrode of the capacitor the resistor, and the conductive region such as contacts and conductive layers are formed of a polysilicon film which is not oxidized, so that the fabrication process is simple, and it is possible to improve the metallic step coverage of the contact region, for thus preventing a defective wiring and cracks, and increasing the yield of the device and reliability of the product.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A semiconductor device, comprising:
    a first capacitor electrode over a semiconductor substrate;
    a dielectric layer formed over a portion of the first capacitor electrode;
    an insulating layer adjacent the dielectric having a prescribed height relative to the dielectric, wherein the insulating layer defines a first capacitor electrode contact region and a second capacitor electrode region;
    a second capacitor electrode formed in the second capacitor electrode region;
    a first electrode connection layer formed in the first capacitor electrode contact region, wherein interfaces between the first electrode connection layer and the insulating layer are continuous in an intersection region around the first electrode, the first electrode connection layer and the insulating layer; and
    a metallic layer contacting the second capacitor electrode in the second capacitor electrode region and the first electrode connection layer, wherein a combined height of the metallic layer and the first electrode connection layer is at least equal to the prescribed height of the insulating layer, and wherein the intersection region effectively prevents step-coverage gaps in the first electrode connection layer to reduce defects in the electrical connection between the metallic layer and the first electrode to increase device reliability.

2. The semiconductor device of claim 1, wherein the second capacitor electrode is polysilicon.

3. The semiconductor device of claim 1, wherein the second capacitor electrode reduces defective wirings caused by step-coverage gaps.

4. The semiconductor device of claim 1, wherein a single integral layer is on the dielectric layer, wherein the single integral layer includes the insulating layer and the first electrode connection layer in the first capacitor electrode contact region, wherein the interfaces between the first electrode connection layer and the insulating layer are determined by a conductive capability of the first electrode connection layer, and wherein the continuous interfaces increase device reliability by preventing step-coverage gaps in the intersection region of the first capacitor electrode, the insulating layer and the first electrode connection layer.

5. The device of claim 1, wherein a height of the first electrode connection layer is approximately equal to the prescribed height.

6. A semiconductor device, comprising:
    a gate electrode formed over semiconductor substrate;
    a first insulation layer including sidewall spacers adjacent both lateral sides of the gate electrode, wherein the sidewall spacers have a first prescribed height;
    source/drain regions formed in the substrate at both lateral sides of the sidewall spacers;
    a second insulation layer having a second prescribed height on portions of the source/drain regions in the substrate, wherein the second insulation layer and the sidewall spacers define contact holes corresponding to the source/drain regions;
    a conductive layer in the contact holes on the source/drain regions in the substrate, and wherein a height of the conductive layer in the contact holes is substantially equal to a height of the gate electrode; and
    a metallic layer on the conductive layer, wherein a combined height of the conductive layer and metallic layer is at least equal to the prescribed height of the sidewall spacers, and wherein the conductive layer in the contact holes reduces defects in the electrical connection between the metallic layer and the source/drain regions to increase device reliability.

7. The semiconductor device of claim 6, wherein a single integral layer includes the second insulation layer and the conductive layer in the contact holes, wherein interfaces between the conductive layer and the second insulation layer are determined by a conductive capability of the conductive layer, wherein the interfaces are continuous around an intersection region of the conductive layer, the second insulation layer and the source/drain regions, and wherein the continuous interfaces increase device reliability and prevent step-coverage gaps adjacent and within the intersection region of the source/drain regions, the second insulation layer and the conductive layer.

8. The device of claim 6, wherein the second prescribed height of the second insulation layer is approximately equal to the height of the gate electrode.

9. The device of claim 8, wherein the first insulation layer covers a top surface of the gate electrode, wherein the first prescribed height is approximately equal to the second prescribed height, and wherein a thickness of the first insulation layer on the top surface of the gate electrode is less than a width of the sidewall spacers.

10. The device of claim 6, wherein interfaces between the conductive layer and the second insulation layer are continuous in an intersection region of the source/drain regions, the conductive layer and the second insulation layer, and wherein the intersection region effectively prevents step-coverage gaps in the conductive layer to reduce defects in the electrical connection between the metallic layer and the source/drain regions.

11. A CMOS analog semiconductor apparatus, comprising:
 a semiconductor substrate having a device region of a first well and a second well and a device isolation region formed by a field insulation layer;
 first and second gate electrodes formed on the first and second well regions of the semiconductor substrate, respectively;
 first and second MOS field effect transistors including:
  first and second source/drain regions formed in the first and second wells at both lateral sides of the first and second gate electrodes;
  first insulation layers having a first prescribed height formed at said both lateral sides and an upper surface of each of the first and second gate electrodes, respectively, and wherein the first insulation layers expose the first and second source/drain regions;
  a second insulation layer having a second prescribed height on portions of the source/drain regions, wherein the first and second insulation layers define contact holes over the first and second source/drains;
  a conductive layer in the contact holes on the source/drain regions in the substrate contacting with both lateral sides of the first insulation layer and sides of the second insulation layer, wherein a height of the conductive layer is approximately equal to a height of the first and second gate electrodes, respectively, and approximately equal to the second prescribed height of the second insulation layer;
  a metallic layer contacting with the conductive layer in the contact holes; and
 a capacitor including:
  a lower electrode formed on the field insulation layer of the semiconductor substrate;
  a dielectric formed on the field insulation layer including the lower electrode so as to expose a contact region of the lower electrode, wherein the second insulation layer defines a lower electrode connection region formed on an upper surface of the lower electrode in the contact region and an upper electrode region on an upper surface of the dielectric;
  a lower electrode connection layer formed in the lower electrode connection region of the contact region that contacts a portion of the lower electrode;
  an upper electrode formed in the upper electrode region; and
  wherein the second insulation layer is further formed in the contact region between the upper electrode and the lower electrode connection layers, wherein the metallic layer forms a contact portion on the upper electrode and on the lower electrode connection layer in the contact region.

12. The apparatus of claim 11, further comprising a resistance device formed on the upper electrode.

13. The apparatus of claim 11, wherein the first prescribed height, a height of the upper surface of the gate electrodes and the second prescribed height are approximately equal.

14. The device of claim 11, wherein interfaces between the conductive layer and the second insulation layer are continuous around an intersection region of the source/drain regions, the conductive layer and the second insulation layer, and wherein the intersection region effectively prevents step-coverage gaps in the conductive layer to reduce defects in the electrical connection between the metallic layer and the source/drain regions.

15. The apparatus of claim 11, wherein a portion of the upper surface of the first insulation layer formed on the lower electrode of the capacitor is used as a capacitor dielectric.

16. The apparatus of claim 11, wherein said first insulation layer is an oxide film of $SiO_2$.

17. The apparatus of claim 11, wherein said second insulation layer is a polysilicon oxide.

18. The apparatus of claim 11, wherein the conductive layer of the CMOS device is surrounded by the first and second insulation layers.

* * * * *